(12) United States Patent
Dokken et al.

(10) Patent No.: US 7,568,139 B2
(45) Date of Patent: Jul. 28, 2009

(54) PROCESS FOR IDENTIFYING THE LOCATION OF A BREAK IN A SCAN CHAIN IN REAL TIME

(75) Inventors: Richard C Dokken, San Ramon, CA (US); Gerald S Chan, Saratoga, CA (US); Takehiko Ishii, Yokohama (JP)

(73) Assignee: Inovys Corporation, Pleasanton, CA (US)

( * ) Notice: Subject to any disclaimer, the term of this patent is extended or adjusted under 35 U.S.C. 154(b) by 269 days.

(21) Appl. No.: 11/609,899

(22) Filed: Dec. 12, 2006

(65) Prior Publication Data

US 2008/0141085 A1    Jun. 12, 2008

(51) Int. Cl.
   *G11R 31/28*   (2006.01)
   *G06F 7/02*   (2006.01)
(52) U.S. Cl. .................... 714/726; 714/732; 714/819

(58) Field of Classification Search .............. 714/724, 714/726, 732, 733, 734, 735, 715, 819, 725
See application file for complete search history.

(56) References Cited

U.S. PATENT DOCUMENTS

| 7,203,877 | B2 * | 4/2007 | Yacobucci | 714/726 |
| 7,430,700 | B2 * | 9/2008 | Yacobucci | 714/738 |
| 2005/0210352 | A1 * | 9/2005 | Ricchetti et al. | 714/733 |
| 2006/0150041 | A1 * | 7/2006 | Yacobucci | 714/726 |
| 2007/0143718 | A1 * | 6/2007 | Abercrombie et al. | 716/4 |

* cited by examiner

*Primary Examiner*—Phung M Chung
(74) *Attorney, Agent, or Firm*—Holland & Hart, LLP

(57) ABSTRACT

A process for identifying the location of a break in a scan chain in real time as fail data is collected from a tester. Processing a test pattern before applying it on a tester provides a signature enabling a method for a tester to identify a scan cell which is stuck during the time the tester is operating on a device under test rather than accumulating voluminous test data sets for delayed offline analysis.

8 Claims, 7 Drawing Sheets

Figure 5. Multiple Scan Patterns and Chains

PROCESS FOR IDENTIFYING THE LOCATION OF A BREAK IN A SCAN CHAIN IN REAL TIME

BACKGROUND

To improve the testability of high density semiconductor devices, modern design practice inserts additional circuitry specific to test, such as scan chains. Defects in scan chains are becoming more common as technology nodes decrease in size and the number of flip-flops in a design increase. Problems often surface in scan chains as mission-critical interconnects are routed first, and scan interconnects are routed later to avoid interfering with the mission-critical layout of the device. A scan chain in test mode is configured to be a very long shift register. If a scan chain is blocked, the tester loses observability and controllability within the circuit and records a massive amount of failures.

As technology nodes shrink, more defects are found in the scan chain circuitry added for the purpose of test. This is due to a number of reasons as described in this document. To bring new integrated circuits to market, and ramp yield to acceptable levels, identifying these defects and learning trends is critical, but can be costly without new approaches.

Scan Basics

To explain the new software process, it is first necessary to provide some background on established techniques of SCAN in semiconductor test. The approach of scan methodology is to replace all flip-flops 102, 104, 106, 108 (FIG. 1) in a design 100 with scan flip-flops 200, 202, 204, 206 (FIG. 2). Scan flip-flops provide two paths into each flip-flop: one (e.g., 208) for the mission of the design, and a second (e.g., 210) to facilitate test.

Scan Flip-Flops

There are two most common methods of implementation today:

MUXD—This scan flip-flop approach places a multiplexer commonly referred to as a mux on the front end of the D-input. The selector to the mux, known as the scan enable, determines whether to use the mission mode input or the scan test input.

LSSD—Another common scan flip-flop approach is to use two clocks. One clock latches the mission path input into the flip-flop while the second clock latches the scan test input data into the flip-flop.

Scan Chains

By stitching all of the scan flip-flops 200, 202, 204, 206 (FIG. 2), or scan cells, together into one or more scan chains 212, each flip-flop can be preset or observed. This allows for test patterns to be constructed which will concentrate on finding faults in mini sub-circuits. See the following circuit example. The first illustration FIG. 1 shows the circuit 100 prior to scan insertion, and the second FIG. 2 shows the circuit 100 after a MUXD scan insertion.

In FIG. 2, notice that each flip-flop (e.g., 202) has two input paths (e.g., 208, 210) as controlled by a mux (e.g., 214) on the input. When the scan enable "SE" 216 is asserted, the scan chain 212 operates as a shift register. This allows for each flip-flop 200, 202, 204, 206 to be set to a specific state. It also allows for the observation of each flip-flop state as the values are shifted out of the device onto the scan output "SO" 218. We have numbered each flip-flop, or scan cell, for the purpose of referencing (i.e., numbers "0"-"3"in FIG. 2).

For this example, the 'and' gate 220 can be tested by shifting data into scan cells 3 and 2. After the desired test condition has been loaded, the scan enable is de-asserted and a clock 222 can be applied to capture the output of the combinational logic as observed at scan cell 1. The scan enable is once more applied and the result data as captured at scan cell 1 can be shifted through the scan chain until it can be seen on the device output for the scan chain.

Defect Models for Scan Chains

Defects in scan chains are becoming increasingly common as technology nodes decrease in size and the number of flip-flops in newer designs grow. Problems often result in scan chains due to the priority of routing in which mission critical interconnects are routed first, and scan interconnects are routed later to avoid interfering with the mission critical layout of the device.

There are a few generally used models for defects in scan chains: blocked chain defect, bridging defect, and hold-time defect.

Blocked Chains

The effect of a blocked chain defect can be determined by observing the scan outputs while in scan mode. If the output of a chain is at a fixed level regardless of the data shifted into the chain, the chain is blocked at one or more points.

Bridging

The effect of a bridging defect can often be determined by observing the number of output changes in chain tests as compared to the number of input changes. As scan chains are essentially very long shift registers when in test mode, what goes in should come out. Regardless of whether the output matches the input, if the output is consistent per the pattern applied, changing one bit on the input pattern should result in a one bit change on the output. If two or more bits change, this is an indication of a bridging condition.

Hold-Time

Due to excessively long wire routes as compared to Clock to Q times of flip-flops, there may not be ample hold-time on the input of one scan flip-flop prior to the change of data on the Q-output of the previous flip-flop in the chain. This condition can be determined by streaming a small number of bits of one data state surrounded by a background of the inverse data state. If the number of bits applied into the chain is decreased as the data exits the scan output, it is likely that a hold-time problem exists.

Testing the Scan Chains

Typically, to insure that the scan chain test logic is operational, tests will be performed on it prior to the functional logic. The most common approach is to present a series of 1's and 0's at the Scan Inputs (SI) 224 (FIG. 3). With the Scan Enable (SE) 216 asserted, the scan chain 212 is essentially a long shift register. Again, with the assertion of the Scan Enable (SE) 216, the functional logic is removed from the test. After 'n' number of clock cycles, where 'n' equals the number of scan cells in the chain, the input stream should be observed on the Scan Output (SO) 218. See the example in FIG. 3.

The Problem: The Blocked Scan Chain

If the scan chain is blocked, the output data will be a solid stream of either 1's or 0's after enough clock cycles are applied to flush the scan cells after the break position. This blockage 400 (FIG. 4), which is becomes more common in smaller nanometer geometries, can be caused either by manufacturing defects, or design errors.

Conventional chain test patterns are implemented as a replicated stream of a '0-0-1-1' sequence, with the result as seen by testers today being a pass/fail result signature of 'pass-pass-fail-fail' or 'fail-fail-pass-pass'. By recognizing this signature, it could be determined that the chain is broken. However, nothing is known about where inside the chain the break 400 exists. See FIG. 4.

It should be pointed out that while the scan output will be a solid stream of either 1's or 0's after a number of clocks are applied equal to the number of scan cells between the output and the block point, the output may, and most all cases will, reach that static output level much prior to the number of clocks.

Functional Tester Background

Historically, testers apply a set of simulated stimulus, and validate that the response on the device outputs match the results expected from the simulation. Functional testers are designed to report in a go/no-go fashion that all of the outputs matched the expected results for all checked strobe points or not. Functional testers are not architected to understand design criteria of the device under test such as the scan structures. Thus, while testers can understand which output signals contained failures, each output signal can represent tens of thousands of internal scan cells.

Thus it can be appreciated that what is needed is a real-time analysis capability, to detect and locate a break in a scan chain while the device under test is still mounted on the automated test equipment, which does not require a special test vector set, which can be applied to any generally useful commercially provided test patterns, which eliminates the need for extensive offline storage, computation, or analysis, and which reduces the amount of data logged to obtain meaningful results to a manageable volume.

SUMMARY OF THE INVENTION

A standard automated test pattern generator (ATPG) stuck-at pattern set is first analyzed for a blocked scan chain signature for each scan cell. The patterns are applied via a tester with scan capability. If there are failures, accumulate the number of high failures and low failures for each scan cell. Then categorize scan cells that exclusively fail high or exclusively fail low in comparison with the blocked scan chain signature. Finally, compute the position of the scan chain blockage based on the transition from sometimes failing, i.e. toggling, to exclusively failing high or low i.e. stuck.

This invention includes a software architecture that can associate each strobe point with an internal scan cell. Thus, when a failure occurs, the controlling software process knows the associated scan cell. To accommodate this, the test pattern controlling software must create a look-up table of each and every "Load-Capture-Unload" operation, also known as a scan pattern, contained in the test pattern set. By knowing the start of the unload operation for each scan pattern, and assuming that all scan chains will unload at the same time, the tester cycle offset from the closest previous unload point prior to a given failure will determine the scan cell position within the chain. The chain will be determined by the output signal of the device.

DETAILED DESCRIPTION

Figure 1:
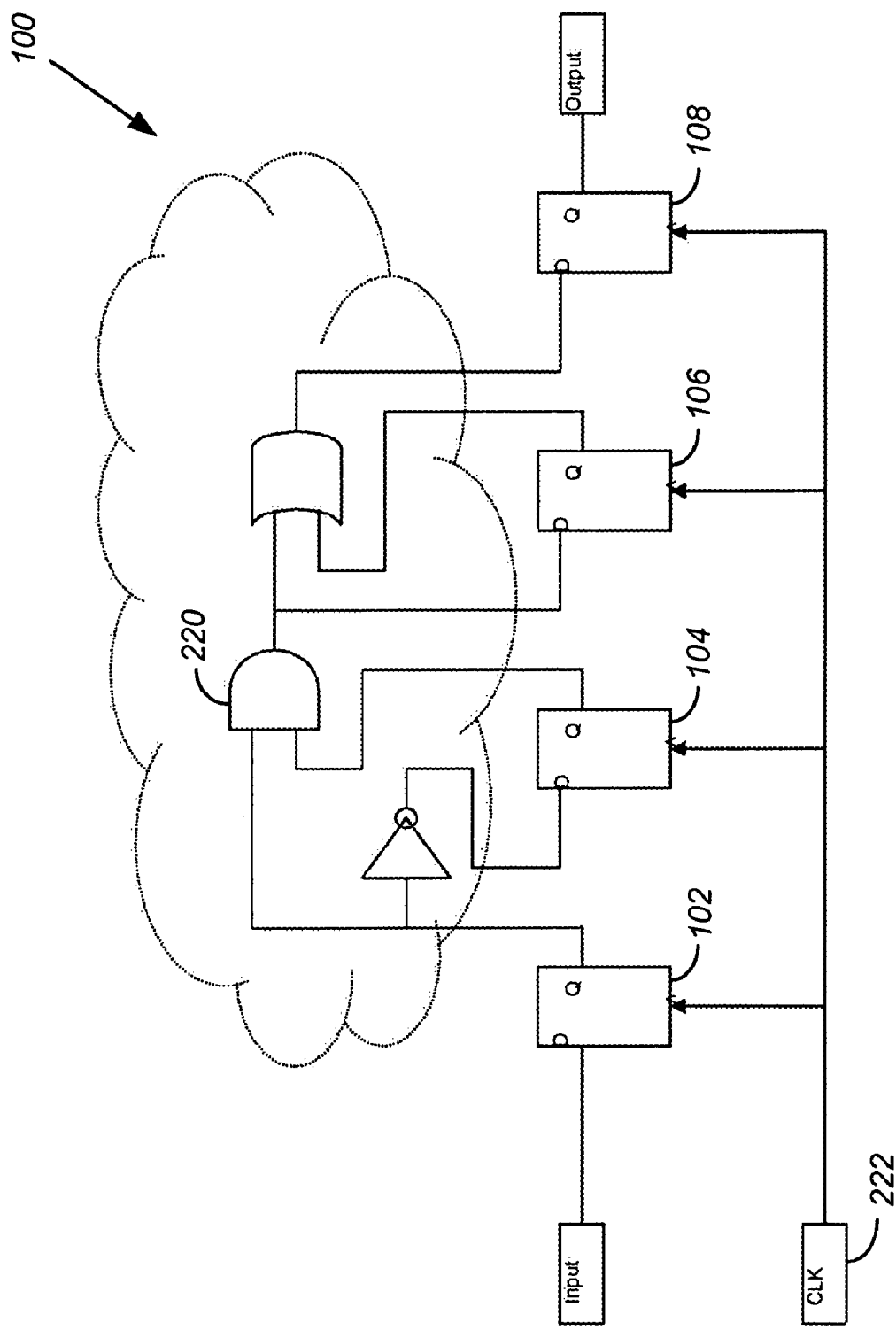
FIG. 1. Logic Circuit Prior to Scan Insertion
FIG. 2. Logic Circuit After Scan Insertion
FIG. 3. Scan Chain Test
FIG. 4. Blocked Scan Chain
FIG. 5. Multiple Scan Patterns and Chains
FIG. 6. Applying Standard ATPG Stuck-At Patterns
FIG. 7. Flowchart of Blocked Scan Chain Localization Process
Figure 2:
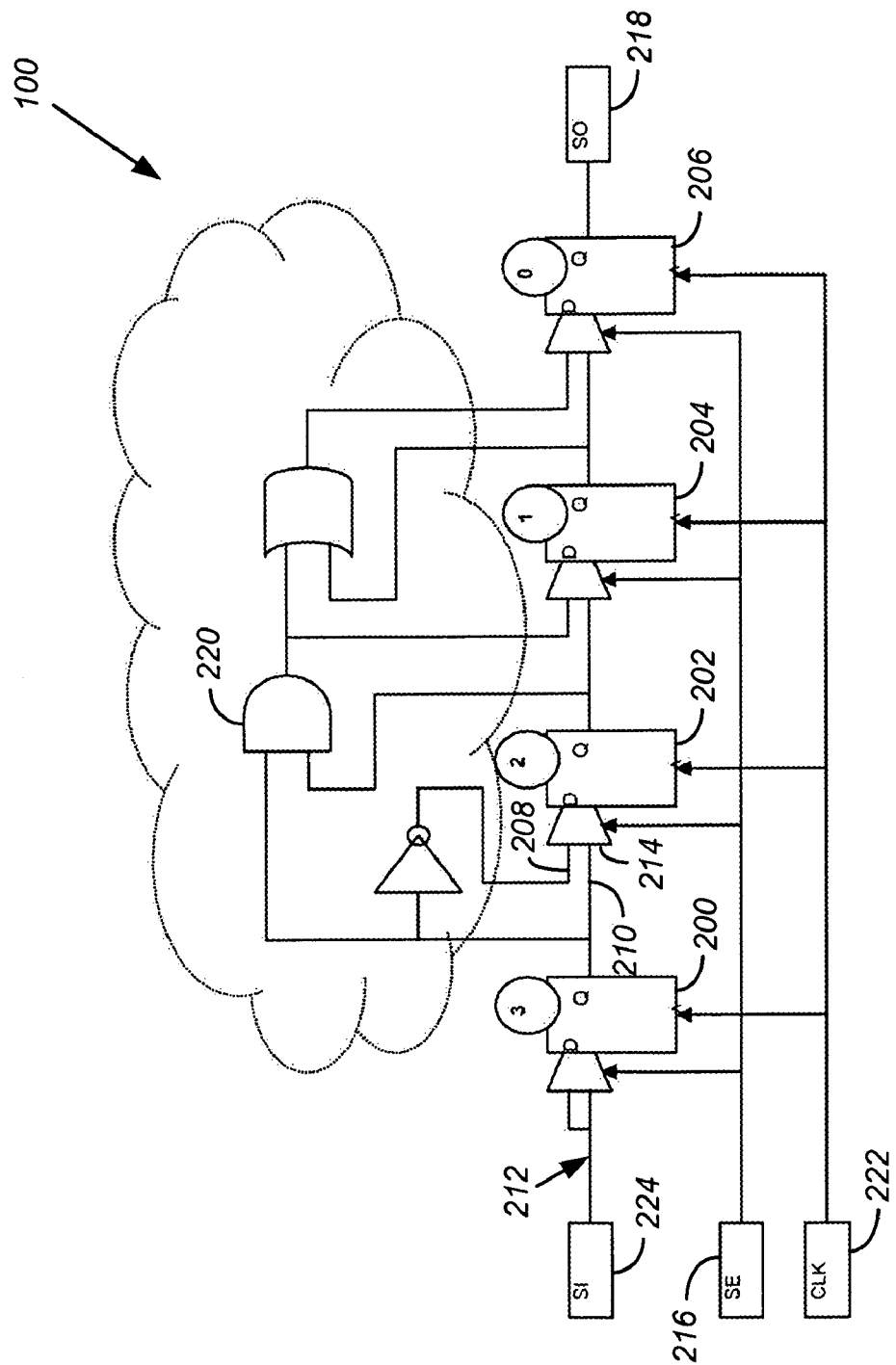
Figure 3:
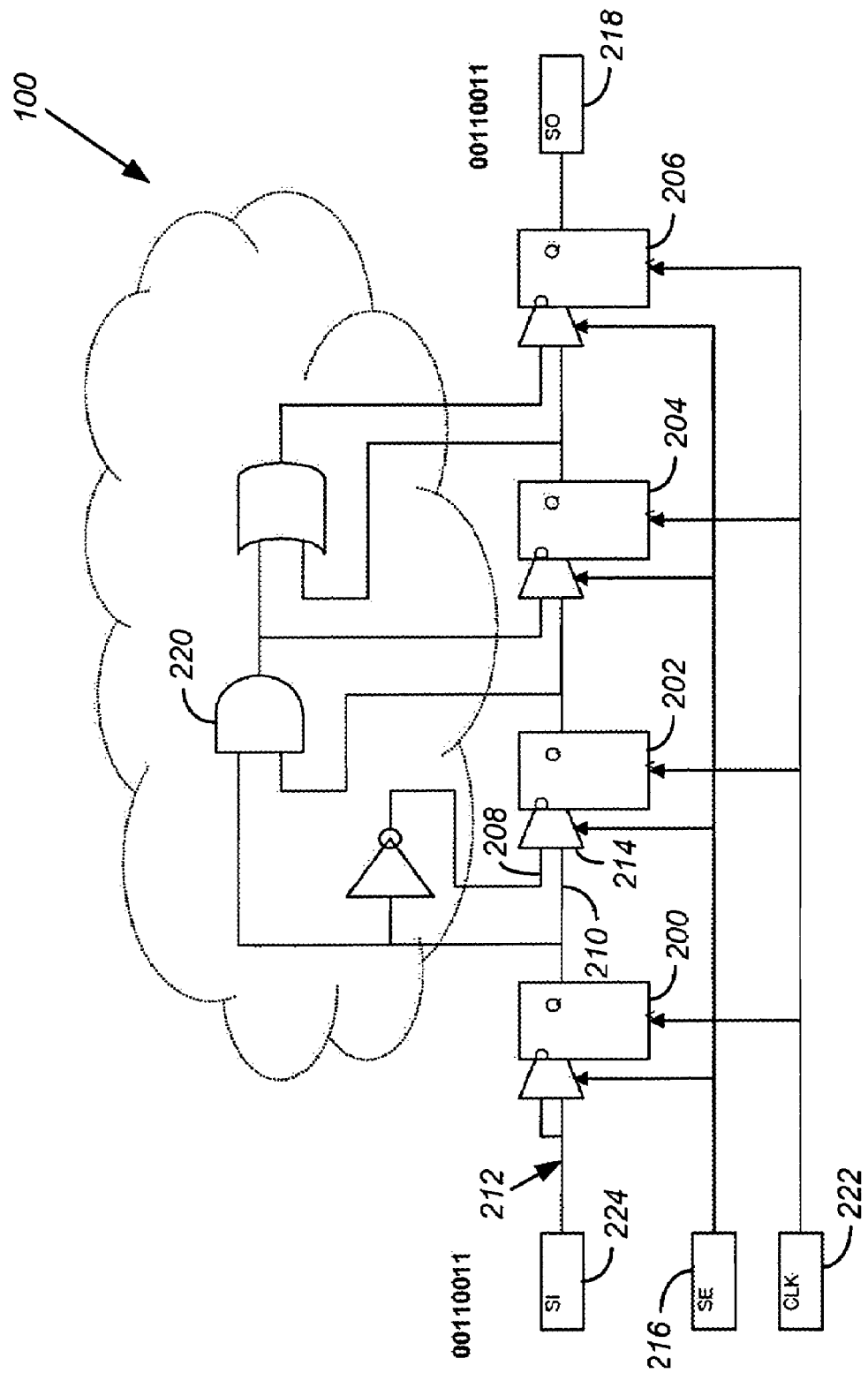
Figure 4:
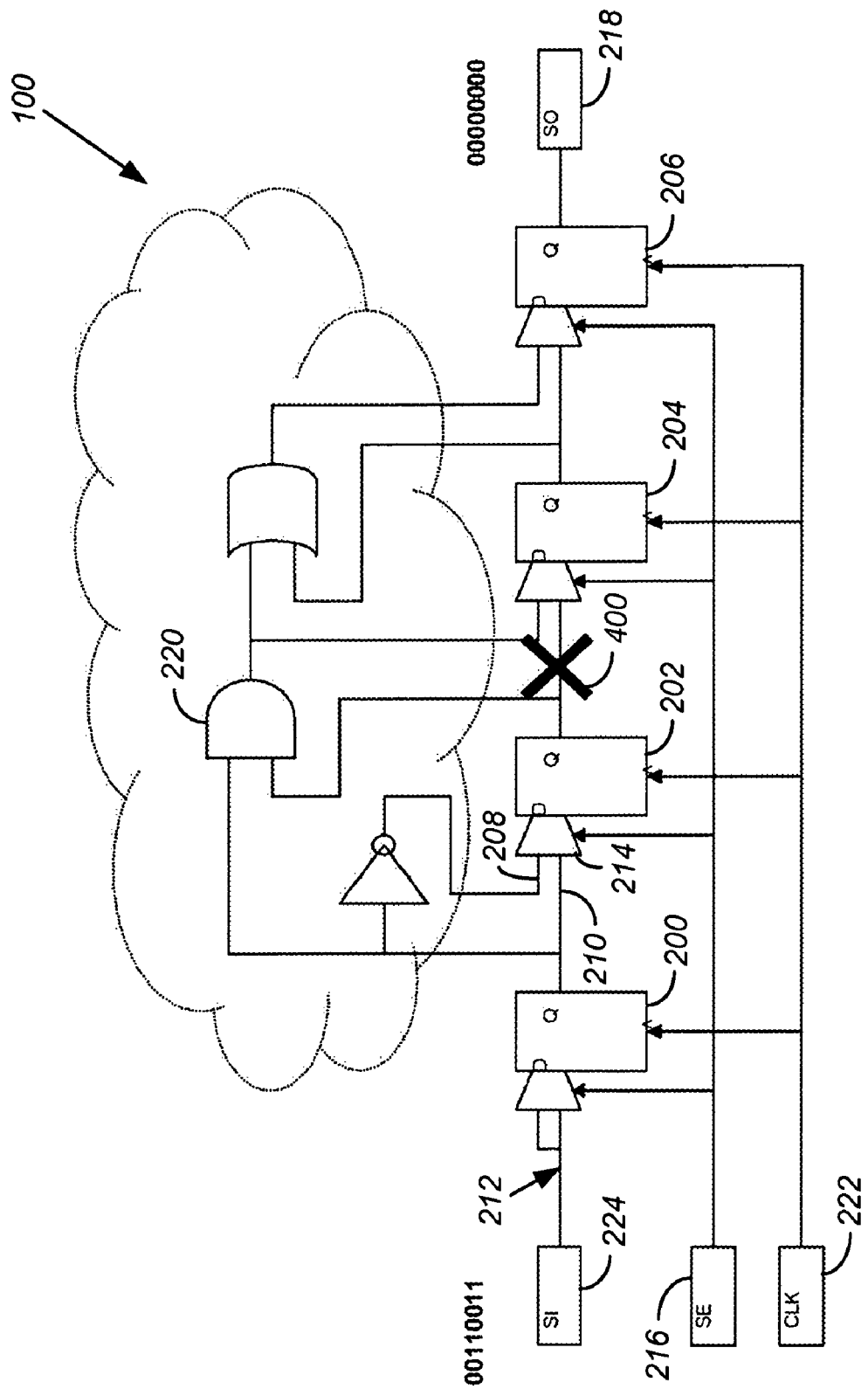
Figure 5:
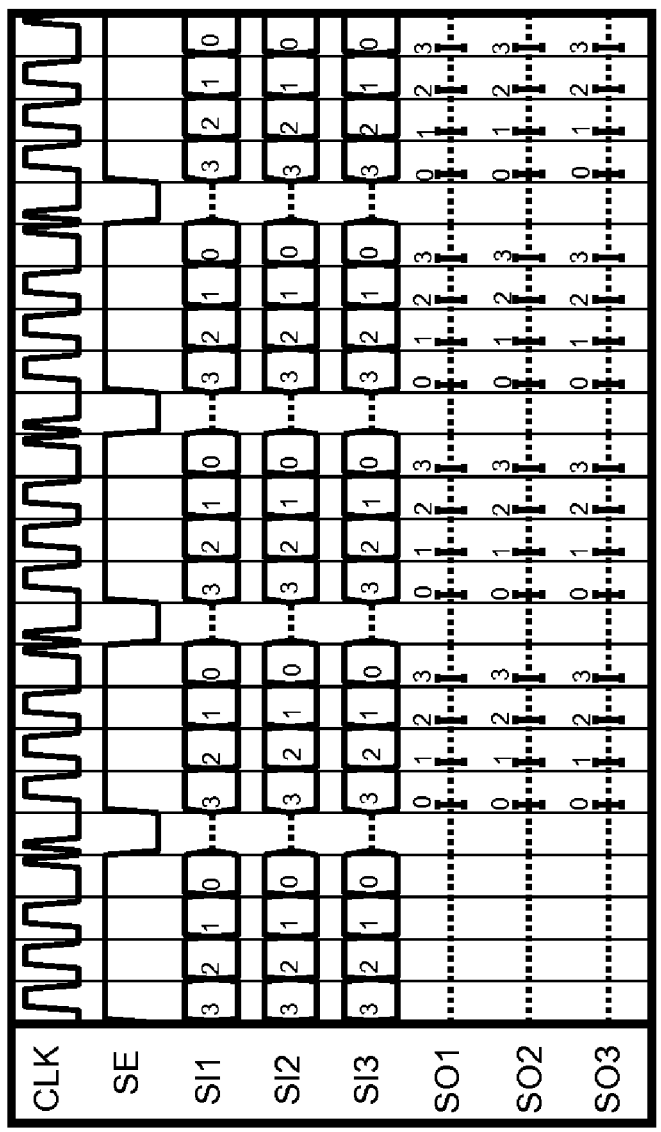

FIG. 4 shows a timing diagram for a test pattern set with four scan patterns, three scan chains, and four scan cells per each chain to illustrate the multiple dimensions. In this example, 48 total strobes are shown for 12 scan cells. For each scan chain, there is a scan output signal. Each scan cell must be stitched into a scan chain.

Applications today may include millions of scan cells. These scan cells are distributed amongst a number of scan chains that may range from a handful to hundreds. Thus, scan chains may contain hundreds of scan cells to tens of thousands. For example, if a device contains 1 million scan cells and 100 scan chains, each scan chain would contain about 10,000 scan cells. The exact number of scan cells in each scan chain is determined by the chip designer. However, the designer usually strives to have balanced scan chains for optimum test time performance.

Regardless of the organization of scan chains, each scan cell is typically strobed per scan pattern. Thus, if the test pattern set contained 10,000 scan patterns for a design that contained 1 million scan cells, there would be a total 10 billion strobes to map to these 1 million scan cells.

The technique for mapping the passes and fails of strobe points to scan cells is to index each strobe point by scan output signal, thus identifying the scan chain. The software keeps a map of the start of the unload operation for each scan pattern by tester cycle count. Thus, when a fail is encountered, the tester cycle count can be referenced against the unload marker to determine the bit position within the chain.

Finding the Position of the Break

Figure 6:
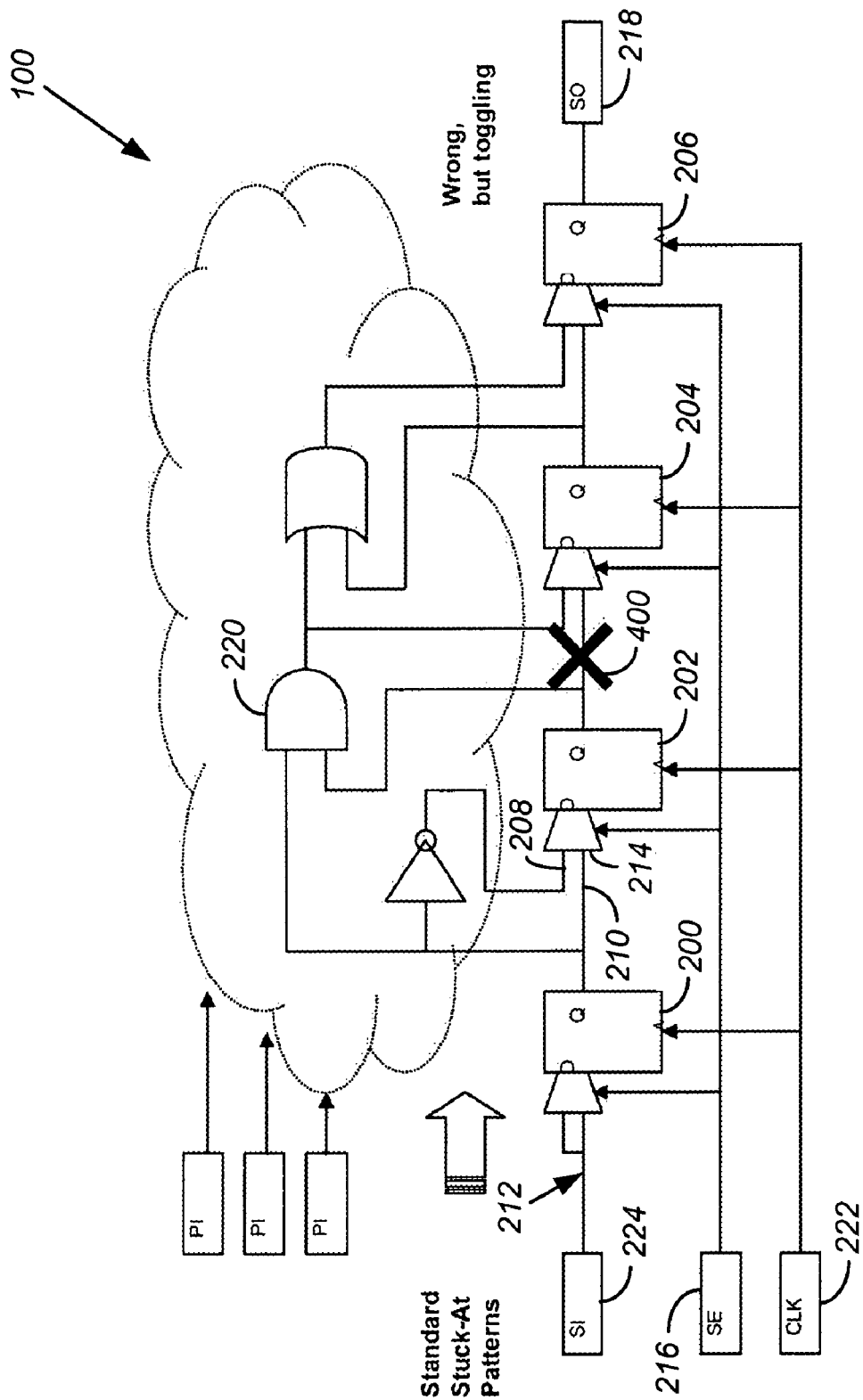

If a scan chain 212 is blocked, applying traditional ATPG Stuck-At patterns will merely result in a massive amount of failures. On traditional testers, this is simply logged as a failure without all of the data. However, the value of the traditional Stuck-At patterns is that the Scan Enable is toggling during the pattern set enabling the functional path into the Scan Cells. This significance of this fundamental point is that pseudo-random data is introduced into the scan chain through the functional path as driven by the combinational logic. Although the chain 212 is blocked, scan cells 200, 202 prior to the blockage 400 in addition to the primary inputs can still load scan cells 204, 206 after the block point with toggling data. As long as enough scan patterns are executed, the scan cells should be able to toggle from the scan output all of the way back up to the blocked point 400. See FIG. 6.

As the output is toggling, the software can record the value of each data bit shifted out for each scan pattern (load-capture-unload sequence) so that each scan cell can be dispositioned into one of three categories:

1. Scan cell was always low
2. Scan cell was always high
3. Scan cell was sometimes low and sometimes high If a scan cell is dispositioned into category 3, there must be a path existing to shift data from this scan cell to the scan output. So, after all scan cells are categorized, an analysis can be performed to find the blocked scan cell. Beginning at the scan input, the first scan cell is suspected to be in category 1 or 2. From that point moving towards the scan output, all scan cells are expected to be of the same category until the blocked scan cell is reached. As soon as the category changes, it must be assumed that data is propagating down the chain towards the scan output. So, it can be concluded that the block point is between the two scan cells where the first category transition has been observed.

An Optimization Technique

The amount of data to be recorded could be quite substantial. For example, to analyze one scan chain with 10,000 bits using just 1000 scan patterns, 10 million bits of data would need to be recorded. This could be reduced statistically by one half if only half of the scan cells are recorded. This can be accomplished by the following method steps:
1. Count the number of high strobes and number of low strobes per scan cell for the pattern set.
2. When recording failures, implement a counting function in the hardware so that the number of high failures and number of low failures can be known.
3. Based upon the number of high strobes, high strobe failures, low strobes, and low strobe failures, determine which category to place the scan cell in. Note, that this will create a potential fourth category of "Indeterminate".

This technique will be explained further in the Blocked Chain Localization Software Process.

The Blocked Chain Localization Software Process

Figure 7:
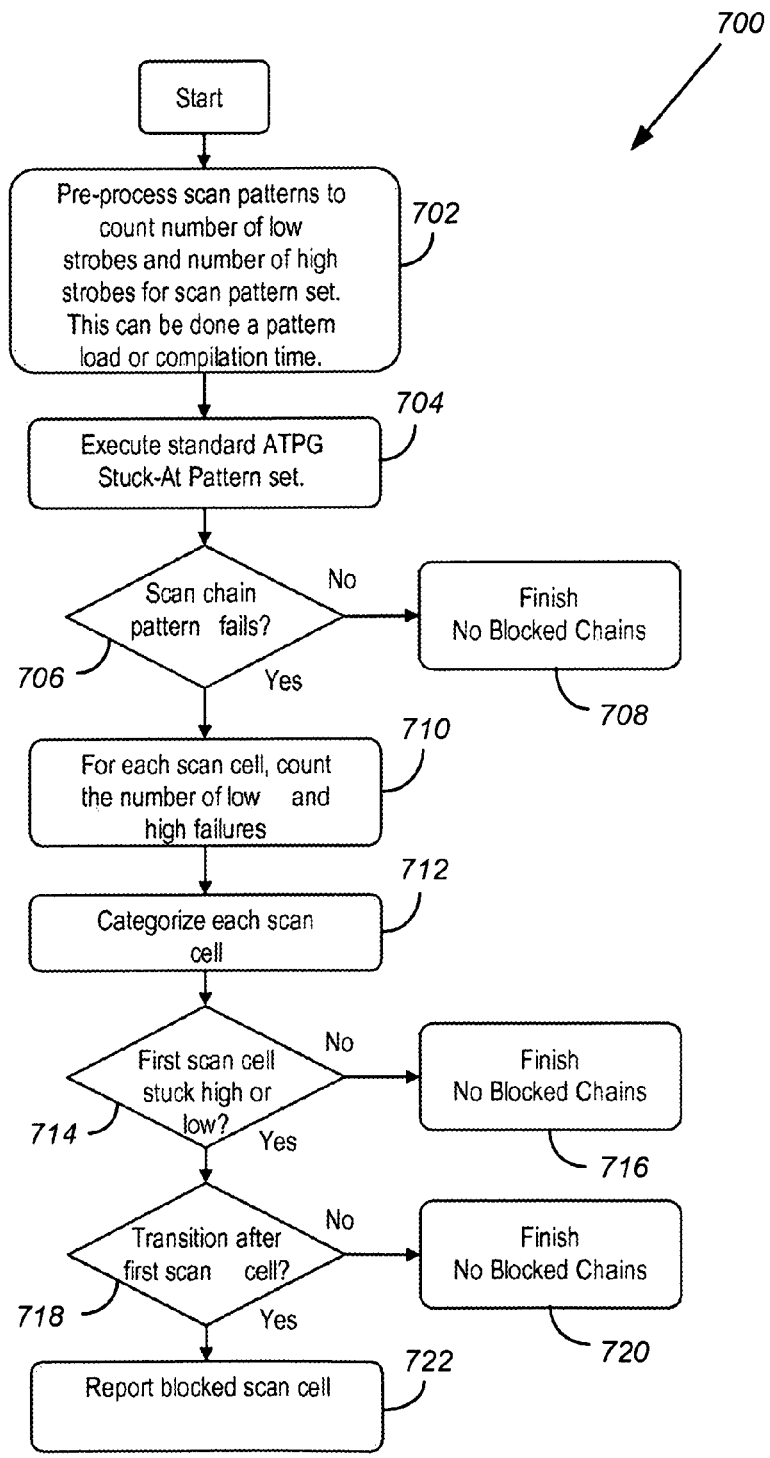

The flow chart in FIG. 7 illustrates the Blocked Scan Chain Localization process. At block 702, scan patterns are preprocessed to count a number of low strobes and a number of high strobes for scan Pattern test. This can be done at pattern load or compilation time. At block 704, a standard ATPG Stuck-At Pattern set is executed. At block 706, a determination is made as to whether a scan chain pattern fails. If "No", the process finishes at block 708, with a conclusion that no blocked chains exist. If "Yes", the numbers of low and high failures are counted for each scan cell at block 710, and each scan cell is categorized at block 712. At block 714, a determination is made as to whether a first scan cell is stuck high or low. If "No", the process finishes at block 716, with a conclusion that no blocked chains exist. If "Yes", it is determined whether there is a transition after the first scan cell (at block 718). If "No", the process finishes at block 720, with a conclusion that no blocked chains exist. If "Yes", the process continues to block 722, and a blocked scan cell is reported.

In an embodiment of the present invention, tangibly embodied in a program product encoded on a computer readable media, a method controls a processor to perform the following steps: computing B the number of consecutive cells from the first scan cell in a chain annotated at least one of Z, V, and T until encountering an initial scan cell annotated S, reporting the location of a scan chain blockage B.

In the present invention strobes are presented as H's and L's in the test patterns that are output from the ATPG tools as ASCII files and wherein the combined number of H's and L's per scan cell is equal to the number of scan patterns V.

A method for enabling a tester to identify the location of a break in a scan chain in real time as fail data is collected on the tester uses the aforementioned strobes in computing a blocked chain analysis signature for each scan cell in a scan chain comprising the step of accumulating the number of low strobes and the number of high strobes in a scan pattern set wherein a high strobe is presented as H and a low strobe is presented as L in the test patterns that are output from the ATPG tools as ASCII files, comparing the number of high strobe failures and the number of low strobe failures with the analysis signature, and assigning a scan cell into one of the categories following: always low, always high, and sometimes low and sometimes high.

Definition List 1

| Term | Definition |
| --- | --- |
| Strobe Counting | Strobes are presented as H's and L's in the test patterns that are output from the ATPG tools as ASCII files. As the software that either loads or prepares these ASCII files for loading into the test hardware parses these files, the H's and L's per scan cell are counted and saved into a record. The combined number of H's and L's per scan cell should equal the number of scan patterns as each scan cell can only be tested once per scan pattern. The result of this step is an integer value per scan cell. |
| Blocked Chain | If the chain test (aka Chain Integrity, or Scan Flush) pattern fails, this is a blocked chain. |
| Fail Counting | As the scan patterns are executed, the number of high failures per scan cell and number of low failures per scan cell are counted for each scan cell in a blocked chain. |
| Stuck High Scan Cell | A scan cell is determined to be in the Stuck-High category if all of the following conditions are met:<br>i. Number of low strobes > 0<br>ii. Number of low failures == Number of low strobes<br>iii. Number of high failures == 0 |
| Stuck Low Scan Cell | A scan cell is determined to be in the Stuck-Low category if all of the following conditions are met:<br>i. Number of high strobes > 0<br>ii. Number of high failures == Number of low strobes<br>iii. Number of low failures == 0 |
| Toggling Scan Cell | A scan cell is determined to be in the Toggling category if all of the following conditions are met:<br>i. Number of low failures < Number of low strobes<br>ii. Number of high failures < Number of high strobes |
| Indeterminate Scan Cell | A scan cell is determined to be in the Indeterminate category if none of the other category conditions are met. |

In conventional semiconductor test processes, analysis of blocked chains is time-consuming, tedious, and often delayed due to a variety of costly steps including, requiring specially devised test vectors such as path delay or transition fault vectors, consuming storage and management of billions of bytes of test log, long analysis times done too late to affect the physical or logical design of the immediate product, and reservation of blocks of time on the tester or computer data center for complex measurement and computation. In contrast the present invention of the Blocked Chain Localization Software Process has the following advantages:

1. Uses standard ATPG Stuck-At Vectors
2. Performs the Analysis in Real-Time
3. Reduces the Amount of Data to Log from Megabytes per Occurrence to Just the Conclusion.
4. Eliminates Offline Analysis

CONCLUSION

The present invention is a method for determining the position of a blockage, B, in a scan chain, M, of N scan cells. B is a number ranging from zero through N, wherein zero represents no blockage at all, and one is the first cell shifted out in a scan chain and N is the last cell shifted out in a scan chain. Firstly the method requires the step of annotating a record for each scan cell with at least one of Z no fails, V all fails, T for toggling and S for stuck.

A scan chain is considered blocked if the last cell in the scan chain is annotated S, but more likely a sequence of cells that end in the last cell are also so annotated.

However, a scan chain is not blocked if every cell in the scan chain is at least one of Z, V, and T, or any combination of these values in which case B is set to zero, By computing B the number of consecutive cells from the first scan cell in a chain annotated at least one of Z, V, and T until encountering an initial scan cell annotated S we have the location of the blockage;

wherein a scan cell record is annotated to be toggling T if the number of low failures is less than the number of low strobes and the number of high failures is less than the number of high strobes, wherein a scan cell record is annotated to be stuck S if the number of low strobes is greater than zero and the number of low failures is equal to the number of low strobes and a number of high failures is equal to zero, or wherein a scan cell record is annotated to be stuck S if the number of high strobes is greater than zero and a number of high failures is equal to the number of low strobes and the number of low failures is equal to zero, wherein a scan cell record is annotated to be zero Z if there are no failures, and wherein a scan cell record is annotated to be V if every strobe results in a failure.

What is claimed is:

1. A method for determining a position of a blockage, B, in a scan chain, M, of N scan cells, wherein B is a number ranging from zero through N, wherein zero represents no blockage at all, and one is the first cell shifted out in a scan chain and N is the last cell shifted out in a scan chain, the method comprising the steps of:

annotating a record for each scan cell with at least one of Z no fails, V all fails, T for toggling and S for stuck;

determining that a scan chain is blocked if the last cell in the scan chain is annotated S, determining that a scan chain is not blocked if every cell in the scan chain is at least one of Z, V, and T, in which case B is set to zero, computing B as a number of consecutive cells from the first scan cell in a chain annotated at least one of Z, V, and T until encountering an initial scan cell annotated S;

wherein a scan cell record for a scan cell is annotated to be toggling T if, in a plurality of test patterns shifted out of the scan chain, i) a number of low failures for the scan cell is less than a number of low strobes loaded into the scan cell for the test patterns, and ii) a number of high failures for the scan cell is less than a number of high strobes loaded into the scan cell for the test patterns, wherein the scan cell record is annotated to be stuck S if the number of low strobes is greater than zero and the number of low failures is equal to the number of low strobes and the number of high failures is equal to zero, wherein the scan cell record is annotated to be stuck S if the number of high strobes is greater than zero and the number of high failures is equal to the number of low strobes and the number of low failures is equal to zero, wherein the scan cell record is annotated to be zero Z if there are no failures, and wherein the scan cell record is annotated to be V if every strobe results in a failure.

2. A method for determining a position of a blockage, B, in a scan chain, M, of N scan cells, wherein B is a number ranging from zero through N, wherein zero represents no blockage at all, and one is the first cell shifted out in a scan chain and N is the last cell shifted out in a scan chain, the method comprising the steps of:

determining that a scan chain is blocked if a record for a last cell in the scan chain is annotated S;

computing N minus B, a number of consecutive cells from the record for a last scan cell in a chain annotated S until encountering a record for a final cell not annotated S; and recording an S into a record for a scan cell on one of the following conditions:

if, in a plurality of test patterns shifted out of the scan chain, a number of low strobes loaded into the scan cell for the test patterns is greater than zero and a number of low failures for the scan cell is equal to the number of low strobes and a number of high failures for the scan cell is equal to zero, and if, in the plurality of test patterns shifted out of the scan chain, a number of high strobes is greater than zero and the number of high failures is equal to the number of high strobes and the number of low failures is equal to zero.

3. The method of claim 2 further comprising the steps of:

annotating a record for each scan cell with at least one of Z no fails, V all fails, T for toggling and S for stuck; and determining that a scan chain is not blocked if every cell in the scan chain is at least one of Z, V, and T, in which case B is set to zero.

4. The method of claim 2 further comprising the step of annotating a record for a scan cell as follows:

annotating a record for a scan cell to be toggling T if the number of low failures is less than the number of low strobes and the number of high failures is less than the number of high strobes, annotating a record for a scan cell to be stuck S if the number of low strobes is greater than zero and the number of low failures is equal to the number of low strobes and a number of high failures is equal to zero, annotating a record for a scan cell to be stuck S if the number of high strobes is greater than zero and a number of high failures is equal to the number of high strobes and the number of low failures is equal to zero.

5. The method of claim 2 further comprising the step of annotating a record for a scan cell as follows:
   annotating a record for a scan cell to be zero Z if there are no failures, annotating a record for a scan cell to be V if every strobe results in a failure.

6. The method of claim 2 further comprising:
   computing B the number of consecutive cells from the first scan cell in a chain annotated at least one of Z, V, and T until encountering an initial scan cell annotated S.

7. The method of claim 2 wherein strobes are presented as H's and L's in the plurality of test patterns, the test patterns being output from ATPG tools as ASCII files, and combined number of H's and L's per scan cell being equal to the number of test patterns.

8. A method for enabling a tester to identify a location of a break in a scan chain in real time as fail data is collected on a tester, the method comprising:

computing a blocked chain analysis signature for each scan cell in a scan chain by:
   accumulating a number of low strobes and a number of high strobes loaded into a scan cell in a scan pattern set, wherein a high strobe is presented as H and a low strobe is presented as L in test patterns that are output from ATPG tools as ASCII files,
   comparing a number of high strobe failures and a number of low strobe failures for the scan cell with the analysis signature, and
   assigning the scan cell into a category selected from: always low, always high, and sometimes low and sometimes high.

* * * * *